United States Patent
Chuan et al.

(10) Patent No.: US 7,220,989 B2
(45) Date of Patent: May 22, 2007

(54) TEST APPARATUS FOR A SEMICONDUCTOR PACKAGE

(75) Inventors: Chin Chen Chuan, Kaohsiung (TW); Pao Ta Jian, Kaohsiung (TW); Shih Ming Huang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 335 days.

(21) Appl. No.: 10/921,188

(22) Filed: Aug. 19, 2004

(65) Prior Publication Data
US 2005/0059173 A1 Mar. 17, 2005

(30) Foreign Application Priority Data
Aug. 22, 2003 (TW) .............................. 92123198 A

(51) Int. Cl.
*H01L 23/58* (2006.01)
(52) U.S. Cl. .................. 257/48; 257/698; 257/724; 257/E23.179; 439/71
(58) Field of Classification Search ............ 257/48
See application file for complete search history.

(56) References Cited

U.S. PATENT DOCUMENTS

| | | | | |
|---|---|---|---|---|
| 5,808,877 A | * | 9/1998 | Jeong et al. ............... | 361/813 |
| 6,062,873 A | | 5/2000 | Kato ........................... | 439/71 |
| 6,083,013 A | | 7/2000 | Yamagishi ................. | 439/71 |
| 6,152,744 A | * | 11/2000 | Maeda ....................... | 439/71 |

* cited by examiner

*Primary Examiner*—Tu-Tu Ho

(57) ABSTRACT

A test apparatus for a semiconductor package which has at least one chip and a plurality of solder balls includes a socket body, a circuit substrate, and a socket lid. The socket body has a plurality of traces electrically connected to an exterior electric test apparatus. The circuit substrate is disposed in the socket body for supporting the semiconductor package and has a plurality of metal extension traces for connecting the solder balls of the semiconductor to the traces of the socket body. The socket lid has a platform body and a soft pad, wherein the platform body presses the semiconductor package and the soft pad is disposed between the platform body and the semiconductor package.

17 Claims, 6 Drawing Sheets

TEST APPARATUS FOR A SEMICONDUCTOR PACKAGE

This application claims the priority benefit of Taiwan Patent Application Serial Number 092123198, filed Aug. 22, 2003, the full disclosure of which is incorporated herein by reference.

BACKGROUND OF THE INVENTION

1. Field of the Invention

The present invention generally relates to a test apparatus for a semiconductor package, and more particularly to a test apparatus for a semiconductor package having a soft pad and capable of testing a multi-chip package and preventing the semiconductor package from damage.

2. Description of the Related Art

With ever increasing demands for miniaturization and higher operating speeds, multichip packages are increasingly attractive in a variety of electronics. Multichip packages that contain more than one chip can minimize volume of the system and enhance the operational speed by combining two or more chips into a single package. In addition, multichip packages decrease the interconnection length between IC chips thereby reducing signal delays and access times.

After packaging, either a single-chip package or a multi-chip must be processed with an assembly test for testing its electrical property. Conventional assembly test for a semiconductor package having array type solder balls is disclosed in U.S. Pat. No. 6,062,873 and U.S. Pat. No. 6,083,013, which are both incorporated herein by reference.

As shown in FIG. 1, U.S. Pat. No. 6,062,873 discloses a socket 10 for testing a semiconductor package 20. The semiconductor package 20 has a chip 2, a substrate 4 and a plurality of solder balls 22. The chip 2 is electrically connected to the substrate 4 by a plurality of bumps (not shown). The socket 10 includes an interposing sheet 12, a circuit substrate 14 and a socket board 16. The interposing sheet 12 has a plurality of metal traces 18 respectively corresponding to a plurality of solder balls 22 of the semiconductor package 20. The circuit substrate 14 has a plurality of metal extending pads 24 and metal bumps 26, which are disposed on the metal extending traces 24 and respectively electrically connected to the metal traces 18. The socket board 16 supports the semiconductor package 20, the interposing sheet 12 and the circuit substrate 14. The socket 10 further includes a socket body 30 and a socket lid 32, wherein the socket body 30 supports the socket board 16 and the socket lid 32 is disposed over the interposing sheet 12. The socket lid 32 and the interposing sheet 12 define a space for receiving the semiconductor package 20. When the socket lid 32 presses the semiconductor package 20, the solder balls 22 are respectively electrically connected to the metal bumps 26. The socket body 30 has a plurality of contact pins 42 for electrically connecting the metal extending traces 24 to an external electrical device (not shown), thereby testing the electrical property of the semiconductor package 20.

Furthermore, U.S. Pat. No. 6,062,873 discloses an integral circuit (IC) socket, which includes a socket body, a plurality of bow-shaped contact pins and a socket lid. The socket supports the bow-shaped contact pins. A floating member is provided with a plurality of holes for guiding the upper portions of the bow-shaped contact pins. The integral circuit is put on the floating member. When the socket lid presses the integral circuit, the upper portions of the bow-shaped contact pins are respectively electrically connected to a plurality of solder balls of the integral circuit, and the lower portions of the bow-shaped contact pins are electrically connected to an external electrical device (not shown), thereby testing the electrical property of the integral circuit.

However, the above-mentioned socket of conventional test apparatus for a semiconductor package is only applied to a single chip package having a surface with better evenness condition. As shown in FIG. 2, a multi-chip package 70 mainly includes a plurality of chips 52a, 52b, a substrate 54, a plurality of solder balls 72 and a plurality of bumps 56. When the above-mentioned socket is applied to the multi-chip package 70, the chips 52a, 52b of the multi-chip package 70 are not located on the same horizontal plane, i.e., the multi-chip package 70 has a surface with worse evenness condition, and therefore the socket usually generates the bigger force which is focused on the chip with higher height so as to damage the multi-chip package 70 during assembly test. Otherwise, the above-mentioned conventional test apparatus for a semiconductor package also causes the solder balls 72 or the bumps 56 to crack and further decreases the reliability of the multi-chip package.

Accordingly, there exists a need for a test apparatus for a semiconductor package capable of solving the above-mentioned disadvantage.

SUMMARY OF THE INVENTION

It is an object of the present invention to provide a test apparatus for a semiconductor package capable of testing a multi-chip package and preventing the semiconductor package from damage.

In order to achieve the foregoing object, the present invention provides a test apparatus for a semiconductor package. The semiconductor package has at least one chip and a plurality of solder balls. The test apparatus includes a socket body, a circuit substrate, and a socket lid. The socket body has a plurality of traces electrically connected to an exterior electric test apparatus. The circuit substrate is disposed in the socket body for supporting the semiconductor package and has a plurality of metal extension traces for connecting the solder balls of the semiconductor to the traces of the socket body. The socket lid has a platform body and a soft pad, wherein the platform body presses the semiconductor package and the soft pad is disposed between the platform body and the semiconductor package.

The soft pad of the socket lid according to the present invention avoids directly pressing the semiconductor package, and therefore the pressure of the socket lid can be evenly distributed on the solder balls or the bumps of the semiconductor package, i.e., the test apparatus can prevent the solder balls or the bumps from crack and further increase reliability of the semiconductor package and test quality and efficiency.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENT

Figure 1:
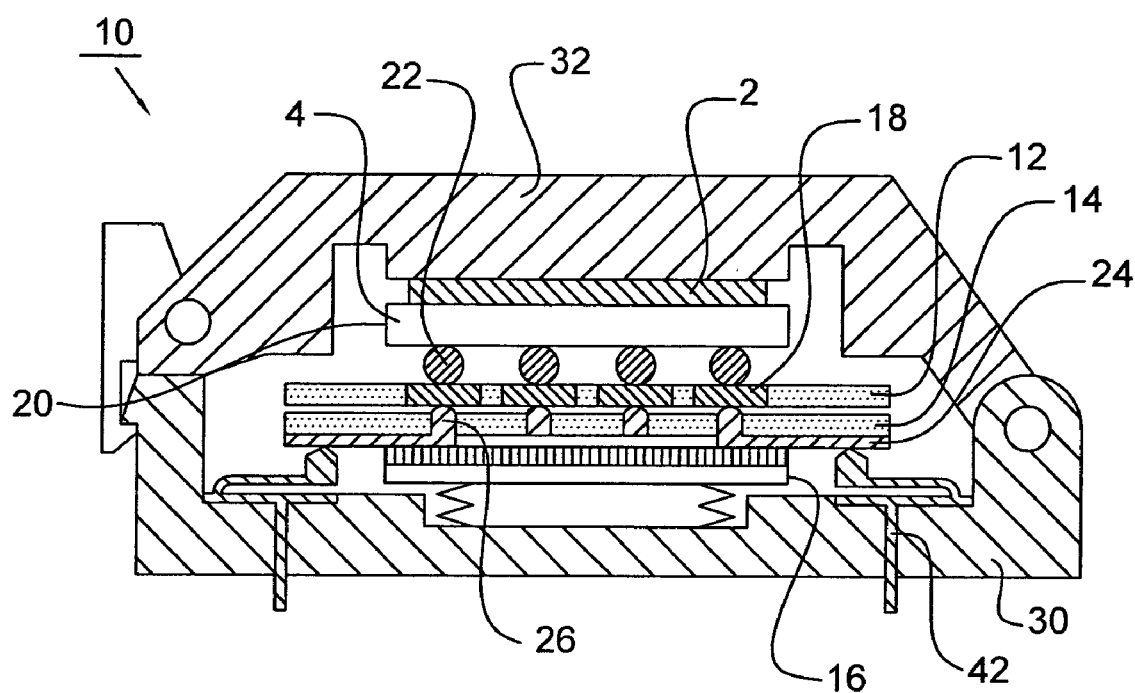
FIG. 1 is a sectional schematic view of a socket in the prior art.
Figure 2:
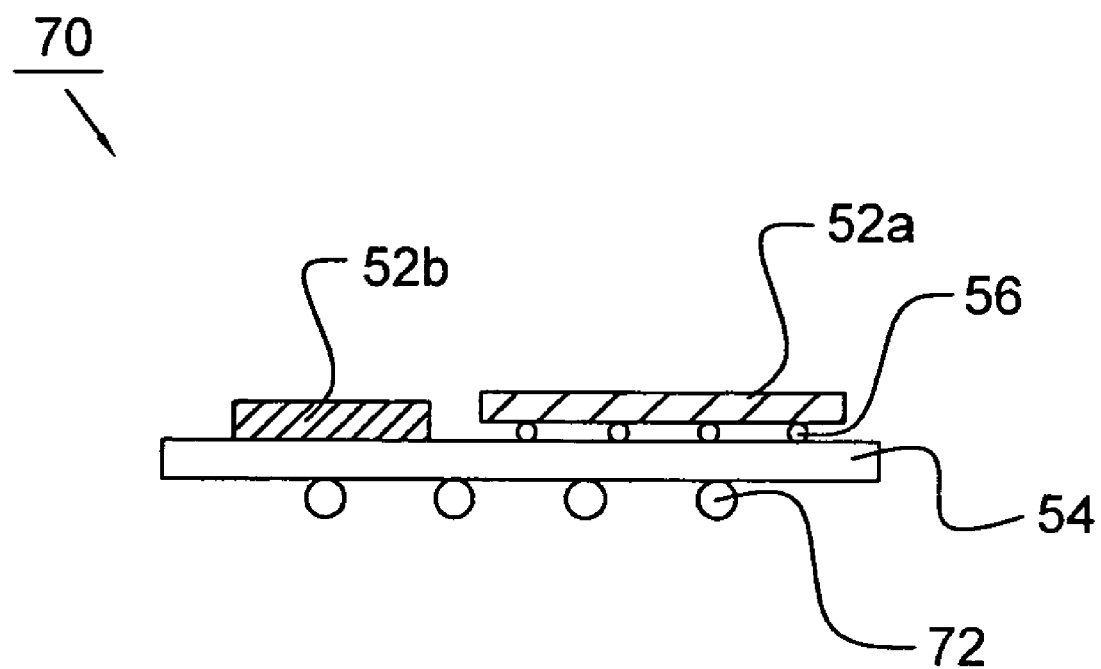
FIG. 2 is a sectional schematic view of a multi-chip package in the prior art.
Figure 3:
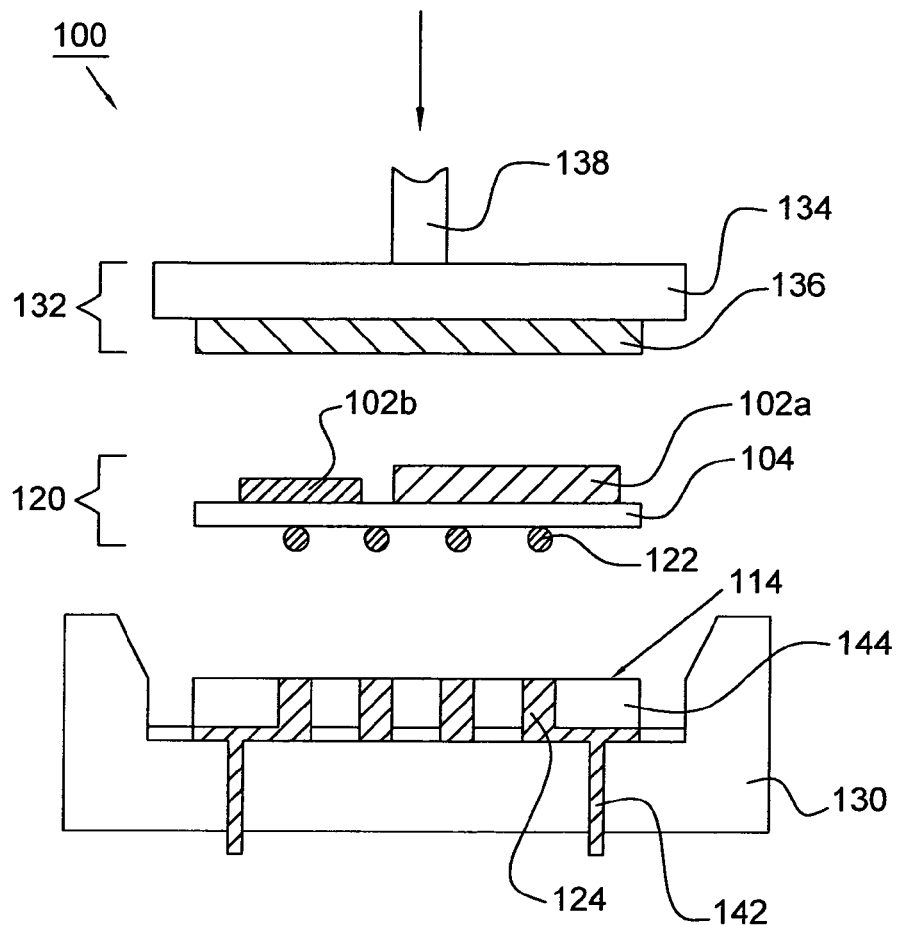
FIG. 3 is a sectional schematic view of a test apparatus according to the first embodiment of the present invention, showing the socket lid pressing a semiconductor package.

Referring to FIG. 3, it depicts a test apparatus 100 according to the first embodiment of the present invention, which is applied to a semiconductor package, e.g. ball grid array (BGA) semiconductor package 120. The ball grid array semiconductor package 120 has a plurality of chips 102a, 102b, a substrate 104 and a plurality of solder balls 122. The chips 102a, 102b are electrically connected to the substrate 104 by bumps (not shown) or using a wire bonding technology.

The test apparatus 100 includes and a socket lid 132, a circuit substrate 114 and a socket body 130. The socket lid 132 has a platform body 134 and a soft pad 136. The platform body 134 presses the ball grid array semiconductor package 120. The soft pad 136 is disposed between the platform body 134 and the ball grid array semiconductor package 120. The soft pad 136 is made of soft material, e.g. silica gel, rubber and plastic.

The socket lid 132 is connected to a driving shaft 138, and the driving shaft 138 is connected to an external driving device (not shown) for driving the socket lid 132 to move upward or downward. The circuit substrate 114 is disposed in the socket body 130 for supporting the ball grid array semiconductor package 120, and has an isolating body 144 and a plurality of metal extension traces 124 disposed in the isolating body 144 and respectively corresponding to the solder balls 122.

Figure 4:
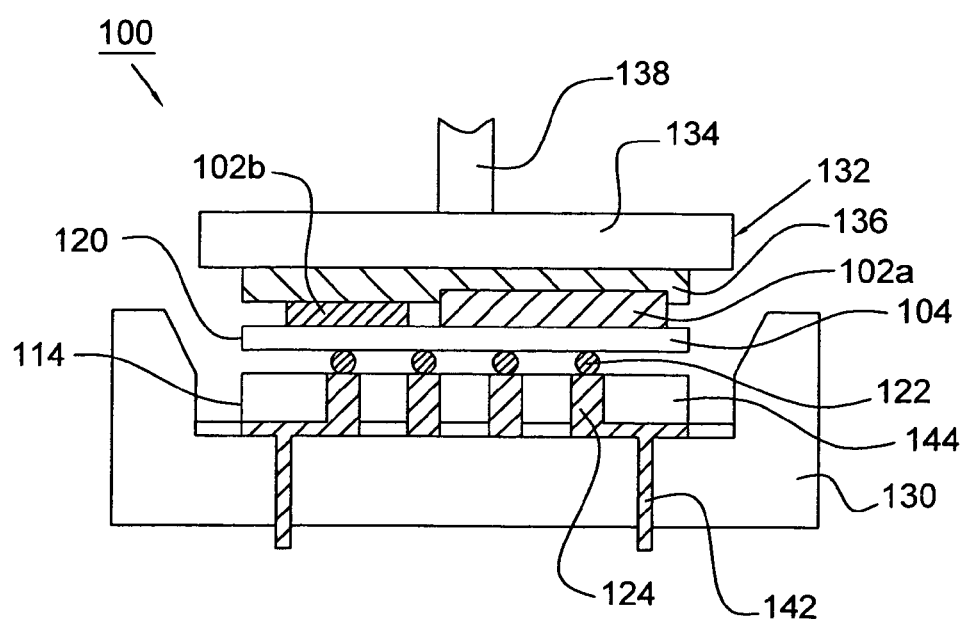
FIG. 4 is a sectional schematic view of a test apparatus according to the first embodiment of the present invention, showing the socket lid not pressing a semiconductor package.

Referring to FIG. 4, the ball grid array semiconductor package 120 is placed on the circuit substrate 114, the soft pad 136 is disposed between the platform body 134 and the semiconductor package 120, then the socket lid 132 is moved downward for pressing the ball grid array semiconductor package 120 to tightly combine with the circuit substrate 114, such that the solder balls 122 are electrically connected to the metal extension traces 124. The socket body 130 has a plurality of traces 142, wherein one end of trace 142 is electrically connected to the metal extension trace 124, and the other end of trace 142 is electrically connected to an external electrical device (not shown), such as a signal testing device, so as to conveniently test the electrical property of the ball grid array semiconductor package 120.

The soft pad 136 of the socket lid 132 avoids directly pressing the ball grid array semiconductor package 120, and therefore the pressure of the socket lid 132 can be evenly distributed on the solder balls 122 or the bumps of the ball grid array semiconductor package 120, i.e., the test apparatus can prevent the solder balls or the bumps from crack and further increase reliability of the semiconductor package and test quality and efficiency.

Figure 5:
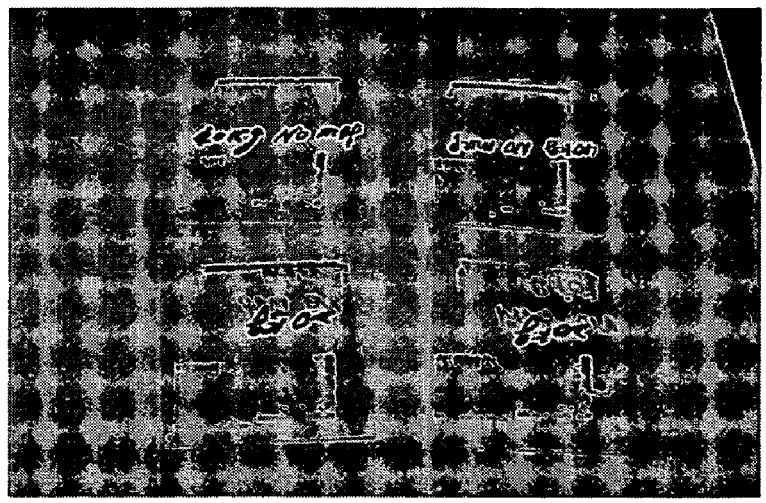
FIG. 5 is a pressure detecting paper for the test apparatus without the software pad, showing experimental result of uneven gray degree.
Figure 6:
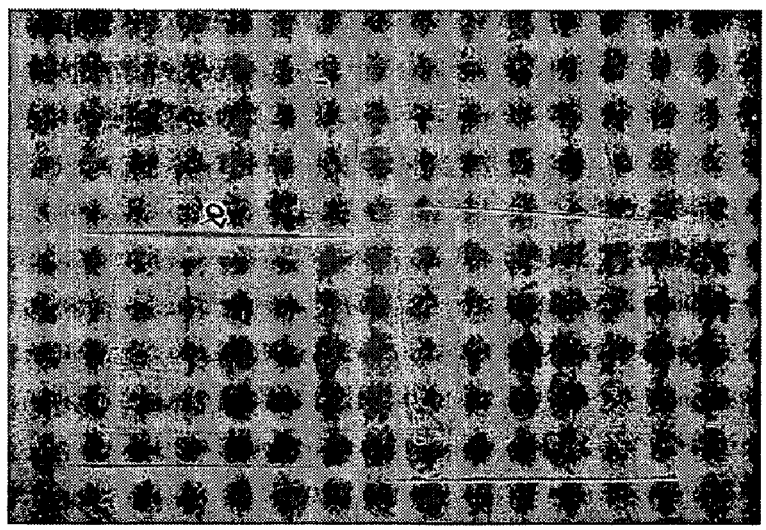
FIG. 6 is a pressure detecting paper for the test apparatus with the software pad, showing experimental result of even gray degree.

According to an experiment, two sets of pressure detecting papers show the distribution of the applied pressure by utilizing gray degree. The pressure detecting papers are put in the test apparatus with the soft pad and without the soft pad, and are put over the ball grid array semiconductor package 120. After testing the ball grid array semiconductor package 120, the pressure detecting papers for the test apparatus without the soft pad is shown in FIG. 5, and the pressure detecting papers for the test apparatus with the soft pad is shown in FIG. 6. It is apparent that the test apparatus with the soft pad generates a buffered pressure, thereby preventing the tested package from damage.

Figure 7:
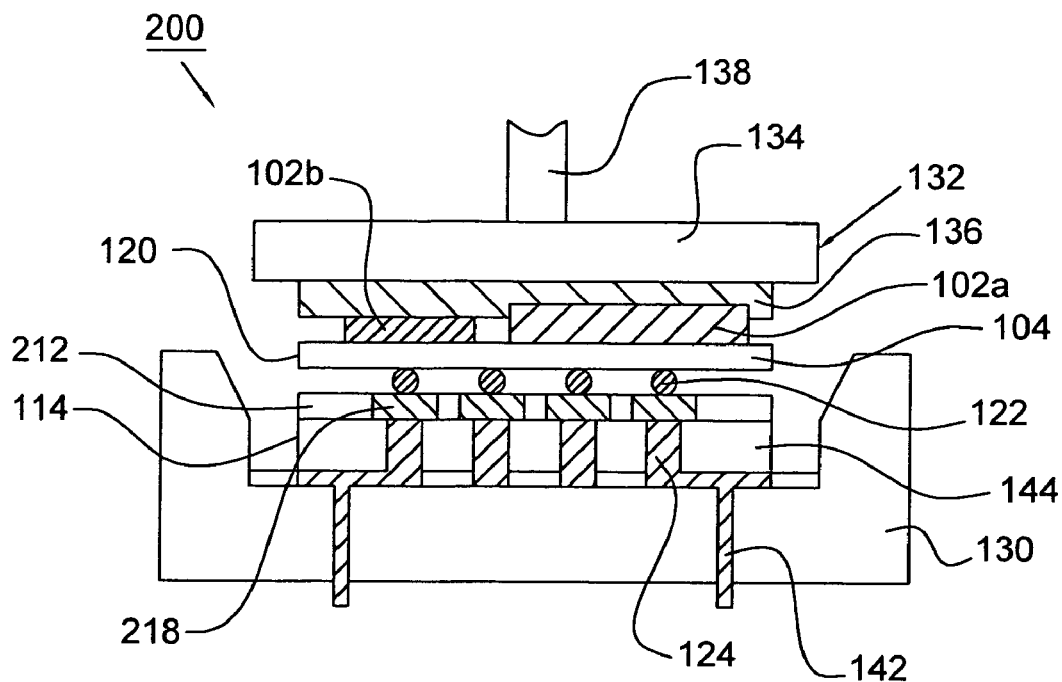
FIG. 7 is a sectional schematic view of a test apparatus according to the second embodiment of the present invention.

Referring to FIG. 7, it depicts a test apparatus 200 according to the second embodiment of the present invention. The relationship between elements of the test apparatus 200 is similar to that of the test apparatus 100 wherein the similar elements are designated with the similar reference numerals. The test apparatus 200 further includes an interposing sheet 212 disposed on the circuit substrate 114. The interposing sheet 112 has a plurality of metal traces 218 respectively corresponding to a plurality of solder balls 122. The diameter of the metal traces 218 is larger than that of the metal extending traces 124 so as to increase the reliability of the solder balls 122 electrically connected to the metal traces 218.

Figure 8:
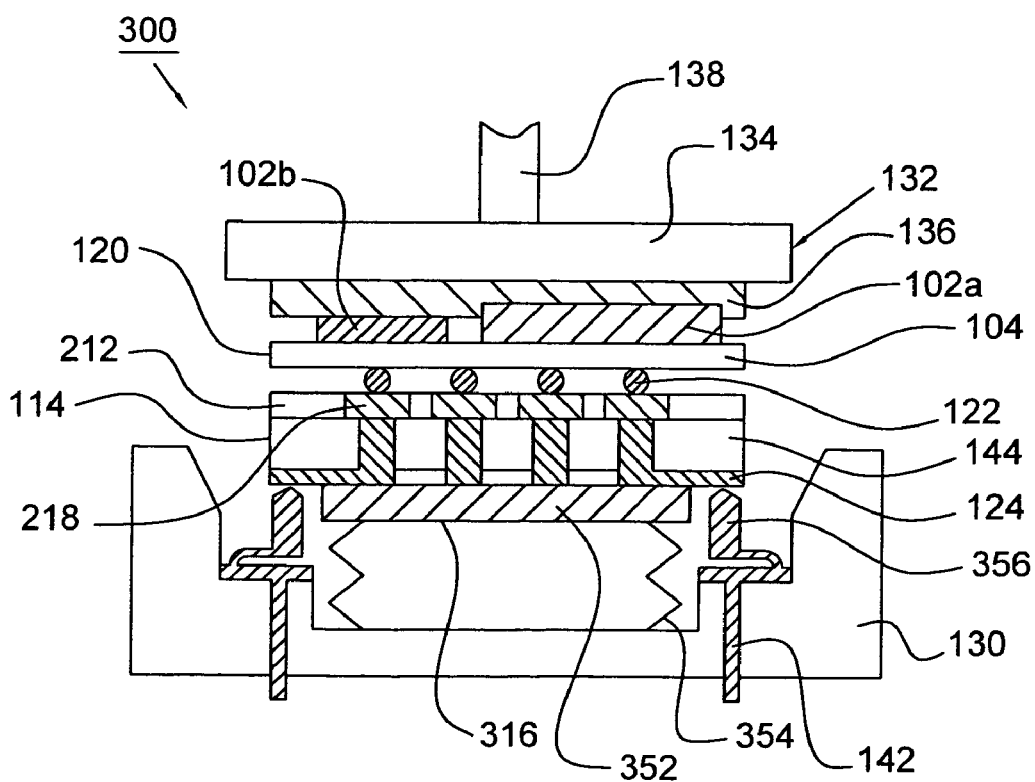
FIG. 8 is a sectional schematic view of a test apparatus according to the third embodiment of the present invention.

Referring to FIG. 8, it depicts a test apparatus 300 according to the third embodiment of the present invention. The relationship between elements of the test apparatus 300 is similar to that of the test apparatus 200 wherein the similar elements are designated with the similar reference numerals. The test apparatus 300 further includes a socket board 316 disposed between the socket body 130 and the circuit substrate 114 for supporting the circuit substrate 114. The socket board 316 has a plate 352 and a spring 354, the plate 352 supports the circuit substrate 114, and the spring 354 is disposed between the socket body 130 and the plate 352 for absorbing the pressure energy of the socket lid 132. The socket body 130 further has a plurality of contact pins 356, which are respectively electrically connecting the metal extending traces 124 to the traces 142.

Figure 9:
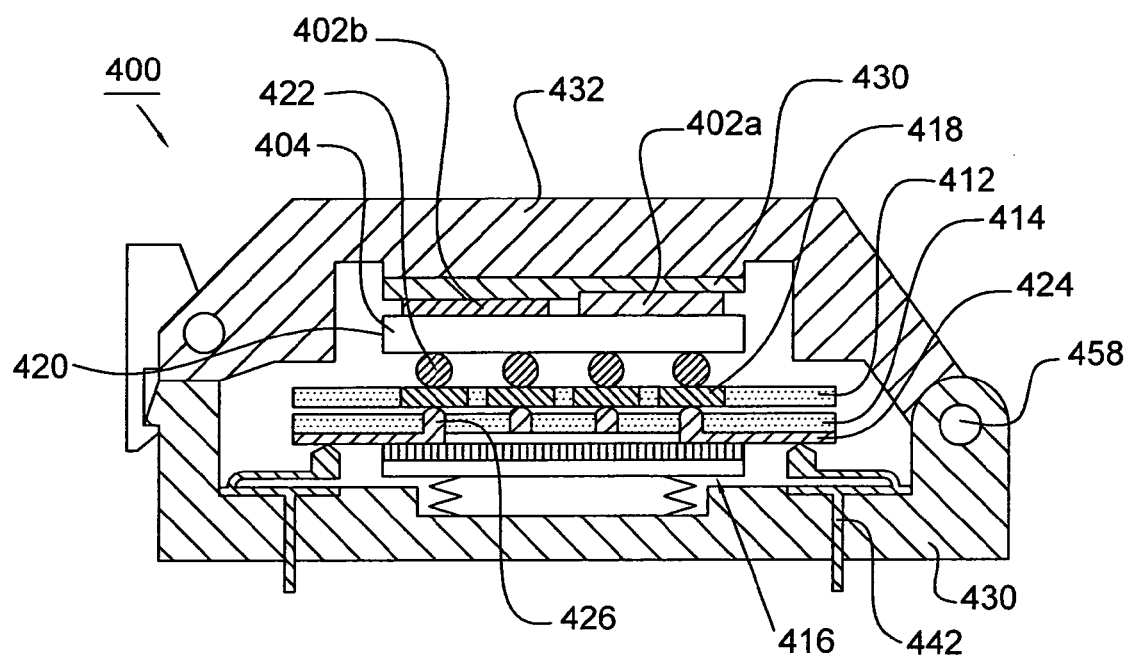
FIG. 9 is a sectional schematic view of a test apparatus according to the fourth embodiment of the present invention.

Referring to FIG. 9, it depicts a test apparatus 400 according to the fourth embodiment of the present invention, which is applied to a ball grid array semiconductor package 420. The ball grid array semiconductor package 420 has a plurality of chips 402a, 402b, a substrate 404 and a plurality of solder balls 422. The chips 402a, 402b are electrically connected to the substrate 404 by using a flip chip connecting technology or a wire bonding technology. The test apparatus 400 includes an interposing sheet 412, a circuit substrate 414 and a socket board 416. The interposing sheet 412 has a plurality of metal traces 418, which are respectively corresponding to the solder balls 422. The circuit substrate 414 has a plurality of metal extending pads 424 and metal bumps 426, which are disposed on the metal extending traces 424 and respectively electrically connected to the metal traces 418. The socket board 416 supports the semiconductor package 420, the interposing sheet 412 and the circuit substrate 414. The test apparatus 400 further includes a socket body 430 and a socket lid 432, wherein the socket body 430 supports the socket board 416. The socket lid 432 has a soft pad 436 which is corresponding to the chips 402a, 402b. The soft pad 436 is made of soft material, e.g. silica gel, rubber and plastic. The soft pad 436 of the socket lid 432 and the interposing sheet 412 define a space for receiving the ball grid array semiconductor package 420. One side of the socket lid 432 is pivotally connected to one side of the socket body 430. When the socket lid 432 presses the ball grid array semiconductor package 420 in the rotational direction of a shaft 458, the solder balls 422 are respectively electrically connected to the metal bumps 426 and further electrically connected to the metal extending pads 424. The socket body 430 has a plurality of contact pins 442 for respectively electrically connecting the metal extending traces 424 to an external electrical device (not shown), thereby conveniently testing the electrical property of the semiconductor package 420.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A test apparatus for a semiconductor package, the semiconductor package having first and second and a plurality of solder balls, the first and second chips being different in height, the test apparatus comprising:
    a socket body having a plurality of traces electrically connected to an exterior electric test apparatus;
    a circuit substrate disposed in the socket body adapted for supporting the semiconductor package and having a plurality of metal extension traces adapted for connecting the solder balls of the semiconductor package to the traces of the socket body; and
    a socket lid including a platform body adapted for pressing the semiconductor package and a soft pad disposed between the platform body and the first and second chips with different heights.

2. The test apparatus as claimed in claim 1, further comprising an interposing sheet disposed between the circuit substrate and the semiconductor package and having a plurality of metal traces respectively electrically connected to the metal extending traces and the solder balls.

3. The test apparatus as claimed in claim 2, wherein the diameter of the metal traces is larger than that of the metal extending traces.

4. A test apparatus for a semiconductor package, the semiconductor package having at least one chip and a plurality of solder balls, the test apparatus comprising:
    a socket body having a plurality of traces electrically connected to an exterior electric test apparatus;
    a circuit substrate disposed in the socket body adapted for supporting the semiconductor package and having a plurality of metal extension traces adapted for connecting the solder balls of the semiconductor package to the traces of the socket body;
    a socket lid including a platform body adapted for pressing the semiconductor package and a soft pad disposed between the platform body and the semiconductor package; and
    a socket board disposed between the socket body and the circuit substrate for supporting the circuit substrate and absorbing the pressure energy of the socket lid.

5. The test apparatus as claimed in claim 4, wherein the socket board has a plate supporting the circuit substrate and a spring disposed between the socket body and the plate, and the socket body further has a plurality of contact pins respectively electrically connected to the metal extending traces and the traces.

6. The test apparatus as claimed in claim 2, wherein the circuit substrate further has a plurality of metal bumps disposed on the metal extending traces and respectively electrically connected to the metal traces.

7. The test apparatus as claimed in claim 1, wherein the socket lid is pivotally connected to the socket body.

8. The test apparatus as claimed in claim 1, wherein the socket lid is driven to move upward or downward by an external driving device.

9. The test apparatus as claimed in claim 1, wherein the soft pad is made of soft material.

10. The test apparatus as claimed in claim 9, wherein the soft pad is made of silica gel.

11. The test apparatus as claimed in claim 9, wherein the soft pad is made of rubber.

12. The test apparatus as claimed in claim 9, wherein the soft pad is made of plastic.

13. A method for testing a semiconductor package, the semiconductor package having first and second and a plurality of solder balls, the first and second chips being different in height, the method comprising the following steps of:
    providing a test apparatus including a platform body, a socket body, and a circuit substrate disposed in the socket body;
    disposing a soft pad on the platform body;
    disposing the semiconductor package on the circuit substrate, wherein the soft pad is disposed between the platform body and the first and second chips with different heights; and
    moving the platform body for pressing the semiconductor package, wherein the socket body has a plurality of traces electrically connected to an exterior electric test apparatus and the circuit substrate has a plurality of metal extension traces for connecting the solder balls of the semiconductor to the traces of the socket body.

14. The method for testing a semiconductor package as claimed in claim 13, wherein the soft pad is made of soft material.

15. The method for testing a semiconductor package as claimed in claim 13, wherein the soft pad is made of silica gel.

16. The method for testing a semiconductor package as claimed in claim 13, wherein the soft pad is made of rubber.

17. The method for testing a semiconductor package as claimed in claim 13, wherein the soft pad is made of plastic.

* * * * *